United States Patent [19]

Smith

[11] Patent Number: 5,517,387
[45] Date of Patent: May 14, 1996

[54] SELECTIVELY ENGAGEABLE INTERFACE FOR CIRCUIT CARDS

[75] Inventor: Michael G. Smith, Tustin, Calif.

[73] Assignee: AST Research, Inc., Irvine, Calif.

[21] Appl. No.: 236,507

[22] Filed: Apr. 29, 1994

[51] Int. Cl.⁶ .............................. G06F 1/16; H05K 7/10; H01R 33/20
[52] U.S. Cl. .......................... 361/686; 361/684; 361/737; 439/259; 439/675
[58] Field of Search ............................ 364/708.1; 439/8, 439/259, 310, 675, 578, 346–348; 361/684, 686, 737, 785

[56] References Cited

U.S. PATENT DOCUMENTS

| | | | |
|---|---|---|---|
| 3,644,873 | 2/1972 | Dalton et al. | 439/299 |
| 4,141,616 | 2/1979 | Gottlieb | 439/263 |
| 4,746,297 | 5/1988 | Soleau | 439/8 |
| 4,843,477 | 6/1989 | Mizutani et al. | 439/259 X |
| 5,089,934 | 2/1992 | Braun et al. | 439/239 X |

Primary Examiner—Michael W. Phillips
Attorney, Agent, or Firm—Knobbe, Martens, Olson & Bear

[57] ABSTRACT

An interface apparatus provides an auxiliary interface between an electronic base unit and a circuit card. The auxiliary interface apparatus may, for example, provide an RF interface between a notebook computer and a PCMCIA circuit card. The auxiliary interface apparatus comprises an auxiliary base connector attached to the base unit, an auxiliary card connector attached to the circuit card, and an actuator device. The actuator device moves the auxiliary base connector between a first position, in which the auxiliary base connector does not make contact with the auxiliary card connector, and a second position, in which the auxiliary base connector does make contact with the auxiliary card connector. The actuator device preferably comprises a rack and pinion device, where the auxiliary base connector is attached to the rack. A pinion gear engages with the rack to move the auxiliary base connector between the first position and the second position. The auxiliary base connector includes a convex, substantially hemispherical surface. The auxiliary card connector includes a concave, substantially hemispherical surface with a plurality of conductor elements.

19 Claims, 11 Drawing Sheets

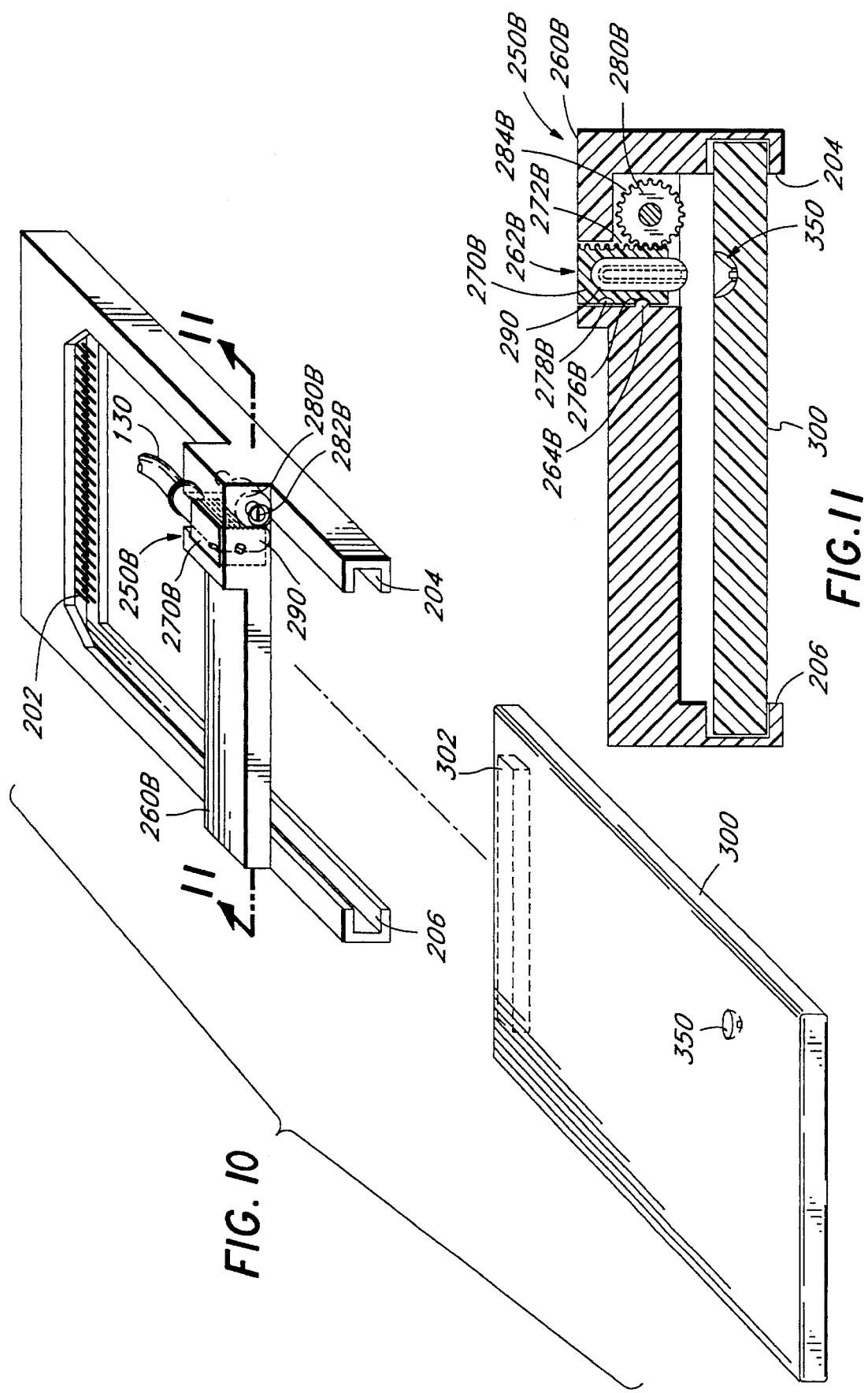

5,517,387

SELECTIVELY ENGAGEABLE INTERFACE FOR CIRCUIT CARDS

BACKGROUND OF THE INVENTION

1. Field of the Invention

The present invention pertains to the field of interface connections for circuit cards. In particular, the present invention pertains to an interface for connecting a circuit card with an electronic unit, in which the interface can be selectively engaged or disengaged.

2. Background Information

A variety of circuit cards are being developed for desktop and portable computers that provide many new capabilities to computer users, including, for example, wireless communication. To implement a wireless communication device on a circuit card, an antenna for transmitting and receiving radio frequency (RF) signals must be provided. Preferably, an antenna is associated with the host computer, instead of each individual circuit card. Thus, an interface is required between a circuit card and an antenna associated with a computer. The interface must provide sufficient bandwidth for efficient communication of RF signals.

Circuit cards implementing wireless communication devices are particularly useful in connection with a notebook computer to provide a portable, wireless communication link. These communication devices are often implemented on a PCMCIA card to allow more convenient portability in a smaller notebook computer. Thus, in particular, an RF interface is required between a PCMCIA card and an antenna associated with a notebook computer. However, the RF interface should not interfere with the operation of circuit cards that do not utilize the antenna. Existing RF interfaces consist of a cable that is routed external to a notebook computer. One end of the cable is connected to an antenna, and the other end is connected to an outward facing end of the PCMCIA card.

SUMMARY OF THE INVENTION

One aspect of the present invention is an interface apparatus for establishing a first interface between an electronic unit and a circuit card. The electronic unit has a first base connector, and the circuit card has a first card connector. The circuit card is insertable into the electronic unit so that the first base connector engages with the first card connector to form a second interface between the electronic unit and the circuit card. The interface apparatus includes a second base connector attached to the electronic unit, and a corresponding second card connector attached to the circuit card. The interface apparatus further includes an actuator device for selectively engaging the second base connector with the second card connector to form the first interface between the electronic unit and the circuit card.

Another aspect of the present invention is an interface apparatus for providing an RF interface between a circuit card and an electronic unit. The interface apparatus includes a base connector connected to the electronic unit. The base connector includes a substantially cylindrical-shaped base inner conductor, a base insulator surrounding the base inner conductor, and a base outer conductor surrounding the base insulator. The base insulator insulates the base inner conductor from the base outer conductor. The interface apparatus further includes a card connector connected to the circuit card. The card connector includes a substantially cylindrical-shaped card inner conductor, a card insulator surrounding the card inner conductor, and a card outer conductor surrounding the card insulator. The card insulator insulates the card inner conductor from the card outer conductor. The interface apparatus further includes an actuator device for engaging the base connector with the card connector so that the base inner conductor makes electrical contact with the card inner conductor and so that the base outer conductor makes electrical contact with the card outer conductor.

A still further aspect of the present invention is an improved interface between a circuit card and a computer. The computer includes a processing unit for executing computer programs and an RF antenna for facilitating wireless communication functions. The improved interface includes a primary interface between the circuit card and the processing unit and an auxiliary interface between the circuit card and the RF antenna. The circuit card utilizes the RF antenna to provide a wireless communication function to the computer. The auxiliary interface includes an auxiliary card connector on the circuit card, and an auxiliary base connector in the computer. The auxiliary base connector is movable between a first position and a second position. The first position allows the circuit card to be inserted into the computer, while the second position provides electrical contact between the auxiliary base connector and the auxiliary card connector when the circuit card is inserted into the computer. The auxiliary interface further includes an actuator device for moving the auxiliary base connector between the first position and the second position.

BRIEF DESCRIPTION OF THE DRAWINGS

FIG. 10 is a perspective view of a PCMCIA card slot and card implementing a second embodiment of the selectively engageable interface of the present invention.

FIG. 11 is a cross-sectional view of the PCMCIA card slot and card of FIG. 10, with the card inserted into the card slot, taken along the lines 11—11 of FIG. 10.

DETAILED DESCRIPTION OF THE PREFERRED EMBODIMENT

Figure 1:
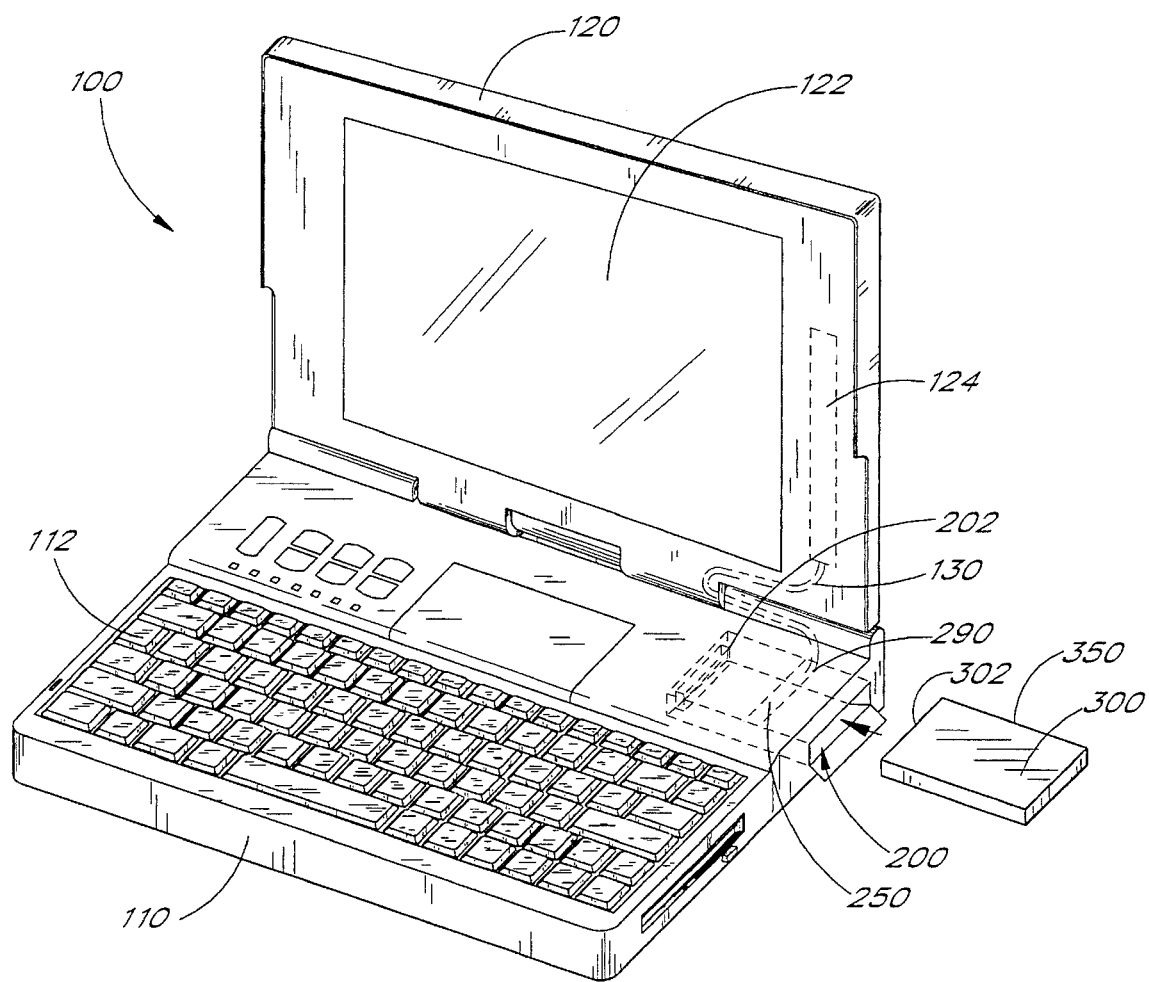
FIG. 1 is a perspective view of a notebook computer having a PCMCIA card slot, along with a PCMCIA circuit card, the card slot and the circuit card implementing a selectively engageable interface of the present invention.

FIG. 1 is a perspective view of a notebook computer 100 and a circuit card 300 implementing a selectively engageable interface of the present invention. In the illustrated embodiment, the circuit card 300 is a PCMCIA circuit card, and the selectively engageable interface provides an RF connection between the notebook computer 100 and the circuit card 300. Although the preferred embodiment is described in connection with the notebook computer 100 and the PCMCIA circuit card 300, the selectively engageable interface of the present invention may be implemented in any electronic unit that receives any type of circuit card. Also, the selectively engageable interface may implement an interface function that is different from an RF interface.

The notebook computer 100 comprises a main unit 110 and a display unit 120. The main unit 110 comprises a keyboard 112, a card slot 200, and a processor unit (not shown). The processor unit is surrounded by an EMI shield (also not shown). The card slot 200 comprises a primary base connector 202, an actuator device 250, and an auxiliary base connector 290. In the present example, the primary base connector 202 is a male PCMCIA connector. The display unit 120 comprises an LCD monitor 122, an RF antenna 124, a coaxial cable 130, and a display circuit (not shown). The display circuit is surrounded by an EMI shield (not shown).

The circuit card 300 comprises a primary card connector 302, an auxiliary card connector 350 (shown more clearly in FIG. 4), and an RF circuit (not shown). In the present example, the primary card connector 302 is a female PCMCIA connector. The preferred embodiment of the selectively engageable interface of the present invention comprises the actuator device 250, the auxiliary base connector 290, and the auxiliary card connector 350.

Figure 2:
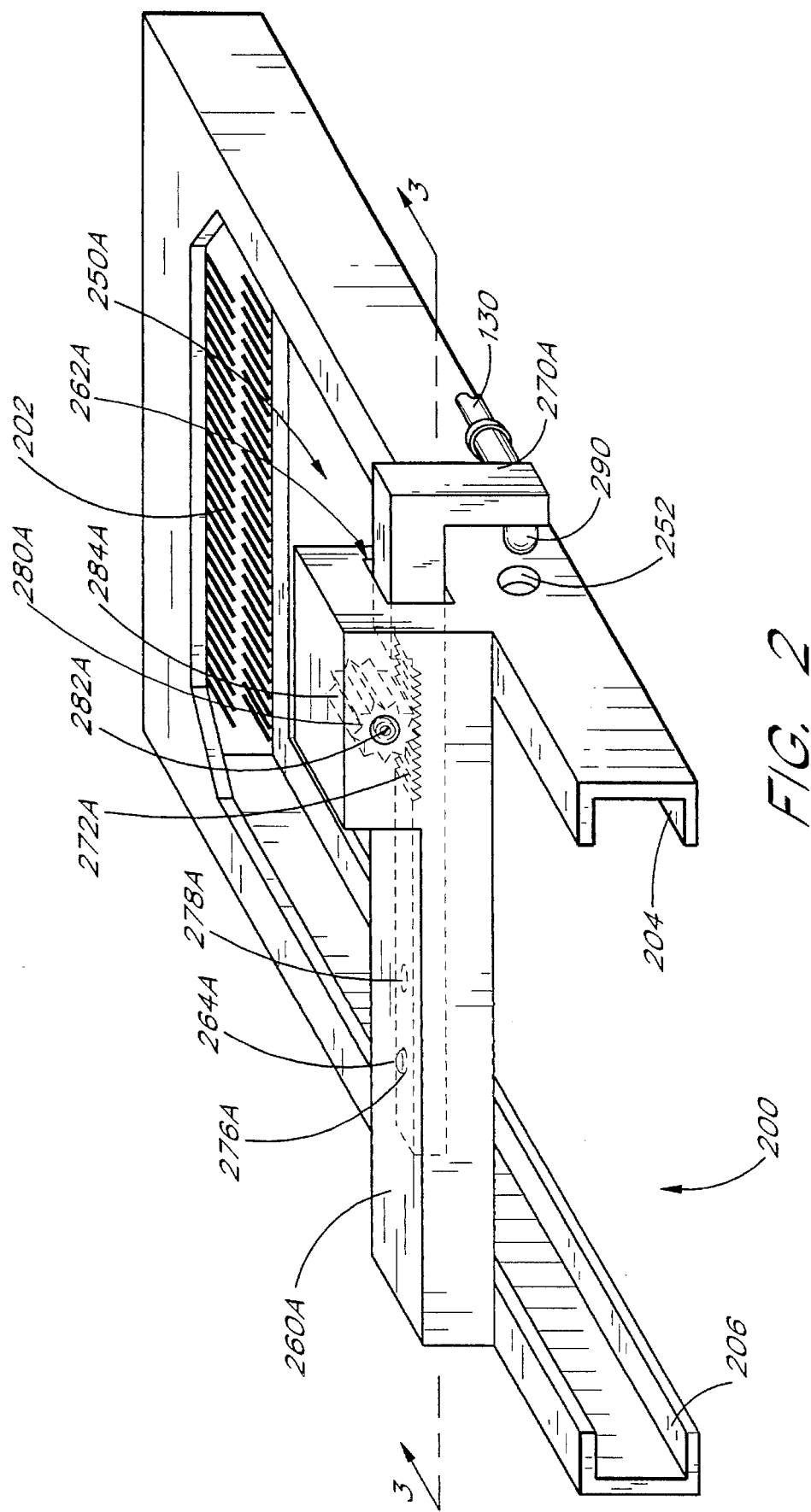
FIG. 2 is a perspective view of a PCMCIA card slot comprising an auxiliary base connector and an actuator device of a first embodiment of the selectively engageable interface of the present invention.
Figure 3:
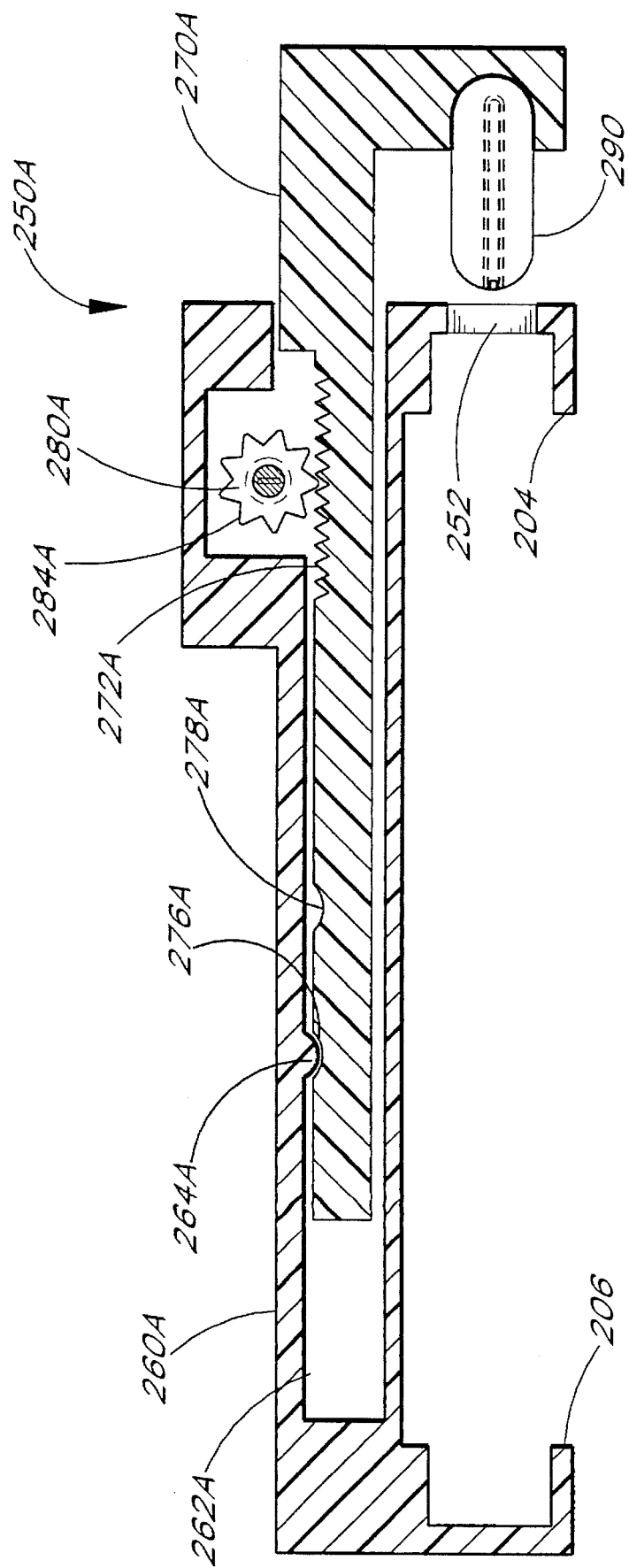
FIG. 3 is a cross-sectional view of the PCMCIA card slot of FIG. 2, taken along the lines 3—3 of FIG. 2.

FIGS. 2 and 3 are a perspective view and a cross-sectional view, respectively, of the card slot 200 of FIG. 1, implementing a first embodiment 250A of the actuator device 250. The card slot 200 comprises the primary base connector 202, a first guide rail 204, a second guide rail 206, an actuator device 250A, an auxiliary connector through-hole 252, and the auxiliary base connector 290. The actuator device 250A represents a specific embodiment (i.e., the first embodiment) of the general actuator device 250. The actuator device 250A comprises an actuator housing 260A, a rack 270A, and a pinion gear 280A. The actuator housing 260A comprises a rack guide 262A for receiving the rack 270A. The actuator housing 260A also contains the pinion gear 280A. The rack guide 262A comprises a protrusion 264A. The rack 270A comprises a set of rack teeth 272A, a first detent 276A and a second detent 278A. The pinion gear 280A comprises a pinion gear driver 282A and a set of pinion gear teeth 284A. FIG. 2 also shows the coaxial cable 130 connected to the auxiliary base connector 290.

Figure 4:
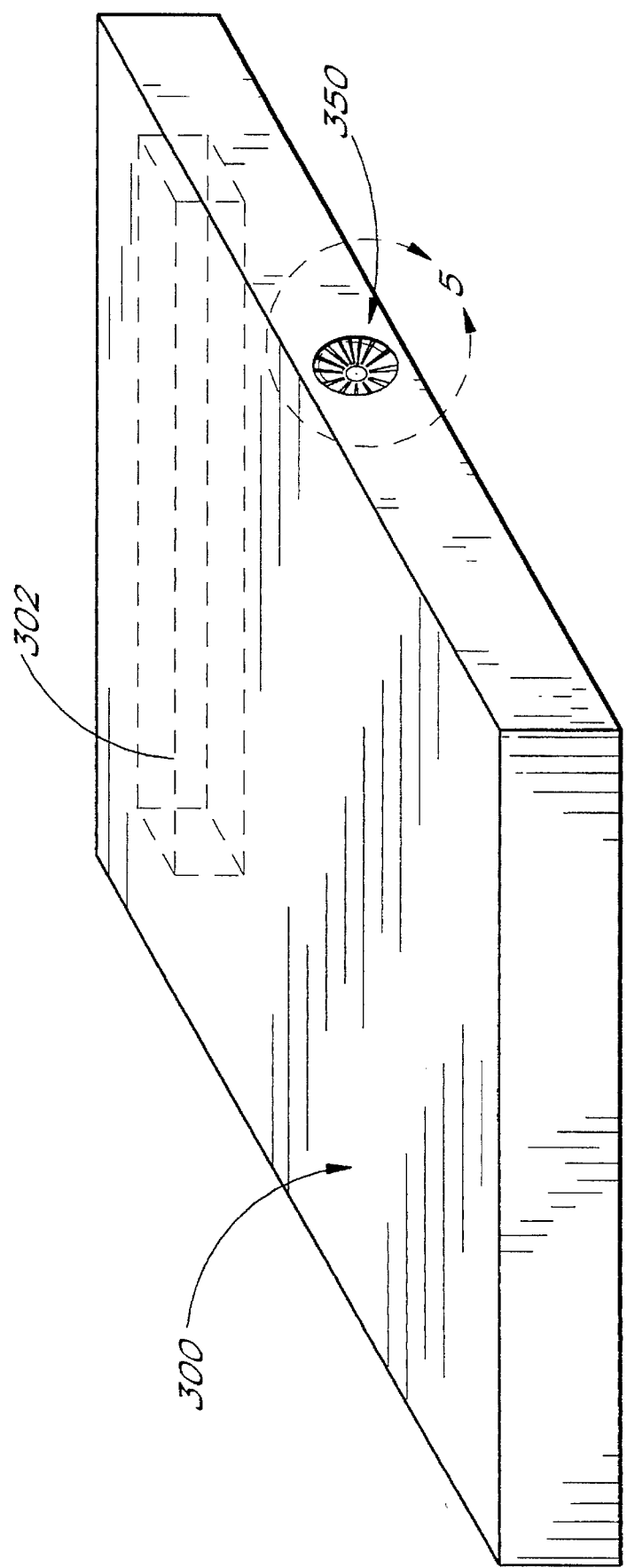
FIG. 4 is a perspective view of a PCMCIA card comprising an auxiliary card connector of the selectively engageable interface of the present invention.

FIG. 4 is a perspective view of the circuit card 300 of FIG. 1. The circuit card 300 comprises the primary card connector 302 and the auxiliary card connector 350.

Figure 5:
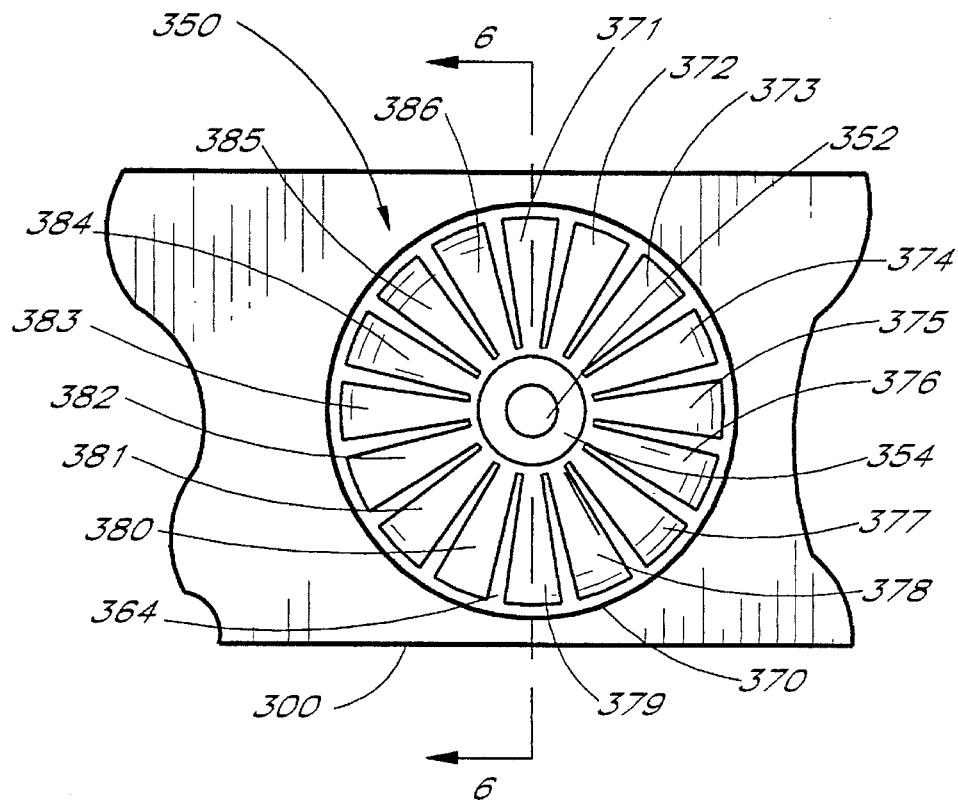
FIG. 5 is an enlarged partial elevational view showing the auxiliary card connector of FIG. 4 in more detail.

FIG. 5 is an enlarged elevational view of the auxiliary card connector 350 of FIG. 4. The auxiliary card connector 350 comprises an inner conductor 352, an insulator 354, a concave, hemispherical stopping surface 364, a first outer conductor 371, a second outer conductor 372, a third outer conductor 373, a fourth outer conductor 374, a fifth outer conductor 375, a sixth outer conductor 376, a seventh outer conductor 377, an eighth outer conductor 378, a ninth outer conductor 379, a tenth outer conductor 380, an eleventh outer conductor 381, a twelfth outer conductor 382, a thirteenth outer conductor 383, a fourteenth outer conductor 384, a fifteenth outer conductor 385, and a sixteenth outer conductor 386. The stopping surface 364 has an inner edge 368 (illustrated in FIG. 6) and an outer edge 370.

Figure 6:
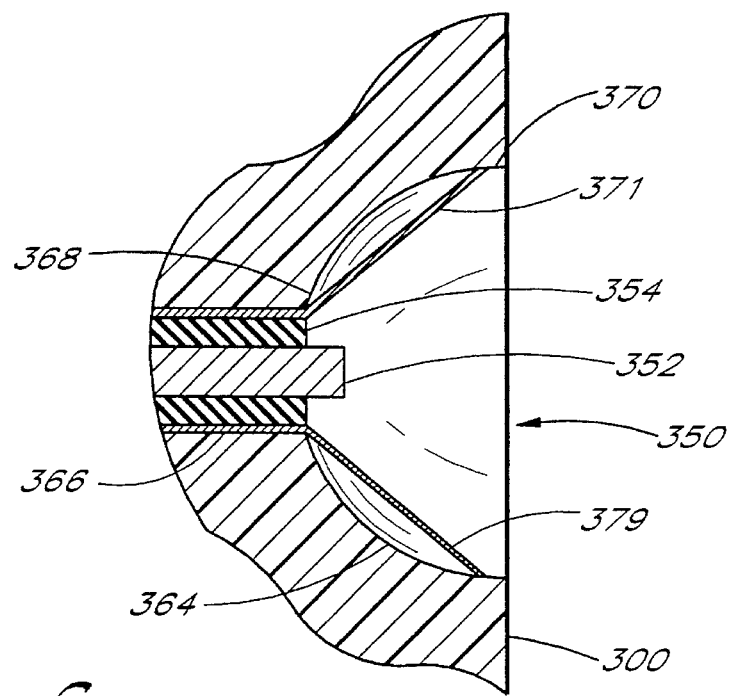
FIG. 6 is a cross-sectional view of the auxiliary card connector of FIGS. 4 and 5, taken along the lines 6—6 of FIG. 5.

FIG. 6 is a cross-sectional view of the auxiliary card connector 350, taken along the lines shown in FIG. 5. As shown in FIG. 6, the auxiliary card connector 350 additionally comprises a shield 366.

Figure 7:
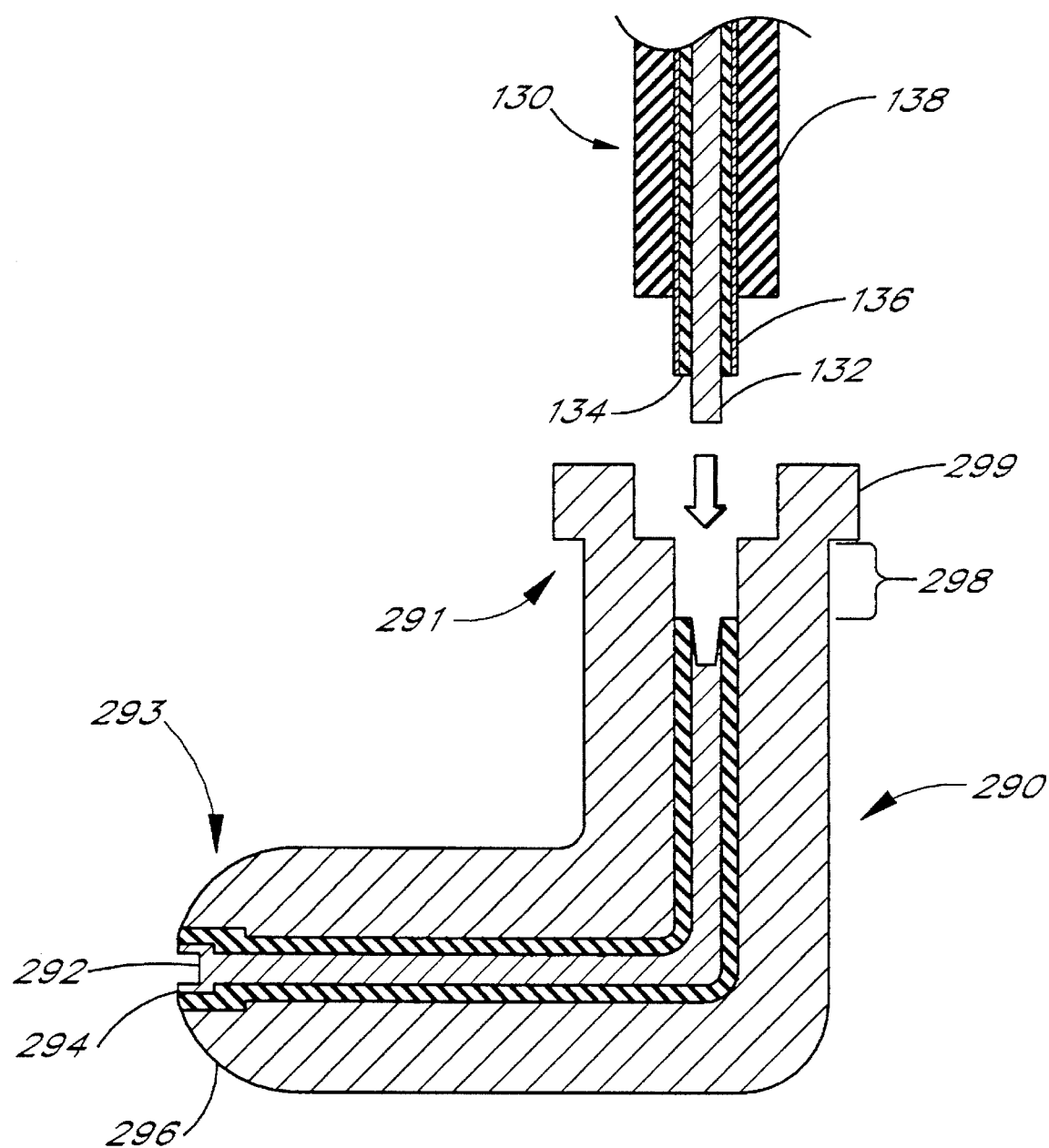
FIG. 7 is a cross-sectional view of the auxiliary base connector and coaxial cable of FIG. 2.

FIG. 7 is a cross-sectional view of the auxiliary base connector 290 and the coaxial cable 130 of FIGS. 2 and 3. The auxiliary base connector 290 comprises an inner conductor 292, an insulator 294, an outer conductor or shield 296, a crimping area 298, and a flange 299. The auxiliary base connector 290 has a first end 291 and a second end 293. The coaxial cable 130 comprises an inner conductor 132, an inner insulator 134, an outer conductor or shield 136, and an outer insulator 138.

Referring again to FIG. 1, the LCD monitor 122 is electrically connected to the display circuit (not shown). The display circuit is electrically connected to the processor unit (not shown). The processor unit is electrically connected to the keyboard 112. The processor unit is also electrically connected to the primary base connector 202. As shown in FIG. 2, the auxiliary base connector 290 is mechanically connected to the actuator device 250, and the auxiliary base connector 290 is electrically and mechanically connected to a first end of the coaxial cable 130. A second end of the coaxial cable 130 is electrically connected to the RF antenna 124 located inside the display unit 120 (see FIG. 1), the preferred placement of the RF antenna 124. Alternatively, the RF antenna 124 can be attached to the outside of the display unit 120, located inside the main unit 110, or attached to the outside of the main unit 110. In any case, the RF antenna 124 cannot be located inside either the EMI shield (not shown) surrounding the display circuit (not shown) or the EMI shield (not shown) surrounding the processor unit (not shown) within the card 300. The primary card connector 302 is electrically connected to the RF circuit (not shown). The auxiliary card connector 350 is also electrically connected to the RF circuit.

Referring again to FIGS. 2 and 3, the primary base connector 202 is mechanically connected to the first guide rail 204 and the second guide rail 206. The actuator housing 260A is mechanically connected to the first guide rail 204 and the second guide rail 206. The actuator housing 260A may advantageously be formed integrally with the first guide rail 204 and the second guide rail 206. The pinion gear 280A is attached in a rotatable manner to the actuator housing 260A. The pinion gear driver 282A is attached to the pinion gear 280A in a manner that causes the pinion gear 280A to rotate when the pinion gear driver 282A is rotated. The rack 270A is inserted inside the rack guide 262A so that the rack teeth 272A engage with the pinion gear teeth 284A. The auxiliary base connector 290 is mechanically attached to the rack 270A.

Referring again to FIG. 4, the primary card connector 302 is attached to a first edge of the circuit card 300, and the auxiliary card connector 350 is attached to a second edge of the circuit card 300.

Referring again to FIGS. 5 and 6, the inner conductor 352 of the auxiliary card connector 350 is preferably a copper wire. The insulator 354 has a hollow cylindrical shape and surrounds the inner conductor 352. The shield 366 also has a hollow cylindrical shape and surrounds the insulator 354. The outer conductors 371–386 are electrically and mechanically connected to the shield 366. Although the outer conductors 371–386 preferably extend substantially to the outer edge 370 of the hemispherical stopping surface 364, the outer conductors 371–386 are not connected to the hemispherical stopping surface 364 in the preferred embodiment. As illustrated in FIG. 6, the outer conductors 371–386 generally form a substantially straight line between the shield 366 and the hemispherical stopping surface 364. The stopping surface 364 preferably has a concave, substantially hemispherical shape. The inner edge 368 of the stopping surface 364 secures the shield 366, the insulator 354, and the inner conductor 352 by forming a snug fit between the inner edge 368 and the shield 366. The stopping surface 364, the shield 366 and the insulator 354 preferably form a concave, substantially hemispherical surface. The inner conductor 352 preferably protrudes from the hemispherical shape formed by the stopping surface 364, the shield 366 and the insulator 354. The inner conductor 352 and the shield 366 make electrical contact with the RF circuit (not shown) inside the circuit card 300.

Referring again to FIG. 7, the inner conductor 292 of the auxiliary base connector 290 is preferably a copper wire. The inner conductor 292 is surrounded by the insulator 294 for substantially the entire length of the inner conductor 292. The outer conductor or shield 296 surrounds the insulator 294 for substantially the entire length of the insulator 294. The inner conductor 292, the insulator 294, and the outer conductor or shield 296 have generally cylindrical shapes. The shield 296 and the insulator 294 preferably form a convex, substantially hemispherical shape at the second end 293 of the auxiliary base connector 290. The hemispherical surface of the auxiliary base connector 290 generally corresponds to the hemispherical surface of the auxiliary card connector 350. The end of the inner conductor 292 preferably has a surface that is recessed from the hemispherical surface formed by the insulator 294 and the shield 296. As illustrated in FIG. 7, at the second end 293 of the auxiliary base connector 290, the inner conductor 292 forms a hollow-cylindrical shape within the insulator 294 and the shield 296. The coaxial cable 130 is preferably an ordinary coaxial cable, as is well known in the art.

As indicated above, the first end of the coaxial cable 130 is electrically and mechanically connected to the auxiliary base connector 290. Generally, the inner insulator 134 of the coaxial cable 130 insulates the inner conductor 132 from the outer conductor 136, and the insulator 294 of the auxiliary base connector 290 insulates the inner conductor 292 from the outer conductor 296. To make a mechanical and electrical connection between the coaxial cable 130 and the auxiliary base connector 290, the outer insulator 138 is first stripped back at the first end of the coaxial cable 130. Next, the shield 136 and the inner insulator 134 are stripped back to a lesser extent at the first end of the coaxial cable 130, so that the inner conductor 132 protrudes from the inner insulator 134. The first end of the coaxial cable 130 is inserted into the first end 291 of the auxiliary base connector 290. Now, the inner conductor 132 of the coaxial cable 130 makes electrical contact with the inner conductor 292 of the auxiliary base connector 290; the outer conductor 136 of the coaxial cable 130 makes electrical contact with the outer conductor 296 of the auxiliary base connector 290; and the inner insulator 134 of the coaxial cable 130 and the insulator 294 of the auxiliary connector 290 insulate the inner conductors 132 and 292 from the outer conductors 136 and 296. The crimping area 298 is then crimped to create a mechanical connection and to maintain the above-described electrical connections between the coaxial cable 130 and the auxiliary base connector 290.

Referring again to FIGS. 2 and 3, the pinion gear driver 282A of the illustrated embodiment receives and can be rotated by a standard screw driver. The pinion gear driver 282A can be any mechanism that can rotate under operator control. For example, the pinion gear driver 282A may have a knob that can be manually rotated by the operator, or it may receive a screwdriver or Allen wrench. When the pinion gear driver 282A is rotated, the pinion gear 280A rotates in the same direction. The pinion gear teeth 284A engage with the rack teeth 272A to cause the rack 270A to slide within the rack guide 262A. If the pinion gear driver 282A is rotated in a clockwise direction, the rack 270A slides to the left in FIG. 3. If the pinion gear driver 282A is rotated in a counter-clockwise direction, the rack 270A slides to the right in FIG. 3. When the rack 270A is slid to a first position, the first detent 276A of the rack 270A engages with the protrusion 264A of the rack guide 262A. The engagement of the first detent 276A with the protrusion 264A provides a readily detectable mechanical indication to the operator (i.e., positive feedback) that the rack 270A is in the first position. When the rack 270A is slid to a second position, the second detent 278A of the rack 270A engages with the protrusion 264A of the rack guide 262A. The engagement of the second detent 278A with the protrusion 264A provides positive feedback to the operator that the rack 270A is in the second position. The first and second detents 276A and 278A are also preferably used to limit the range of movement of the rack 270A. FIGS. 2 and 3 illustrate the rack 270A in the first position. When moving from the first position to the second position, the rack 270A moves to the left in FIG. 3.

When the rack 270A is slid from the first position toward the second position, the auxiliary base connector 290 approaches and subsequently penetrates the auxiliary connector through-hole 252. When the rack 270A reaches the second position, the auxiliary base connector 290 extends into a gap within the first guide rail 204. As a result, when the rack 270A is in the second position, the circuit card 300 cannot be inserted into or removed from the card slot 200.

When the rack 270A is in the first position, the circuit card 300 can be slid into or out of the card slot 200. The circuit card 300 is inserted into the card slot 200 so that appropriate edges of the circuit card 300 engage with the first guide rail 204 and the second guide rail 206. The circuit card 300 is then pushed into the card slot 200 until the primary card connector 302 fully engages with the primary base connector 202. When the circuit card 300 is fully inserted into the card slot 200, the auxiliary card connector 350 is aligned with the auxiliary connector through-hole 252 and the auxiliary base connector 290. Now, if the rack 270A is moved from the first position to the second position, the auxiliary base connector 290 protrudes through the auxiliary connector through-hole 252 and contacts the auxiliary card connector 350. When the rack 270A is in the first position, the selectively engageable interface of the present invention is disengaged. When the circuit card 300 is inserted into the card slot 200 and the rack 270A is moved to the second position, the selectively engageable interface of the present invention is engaged.

Figure 8:
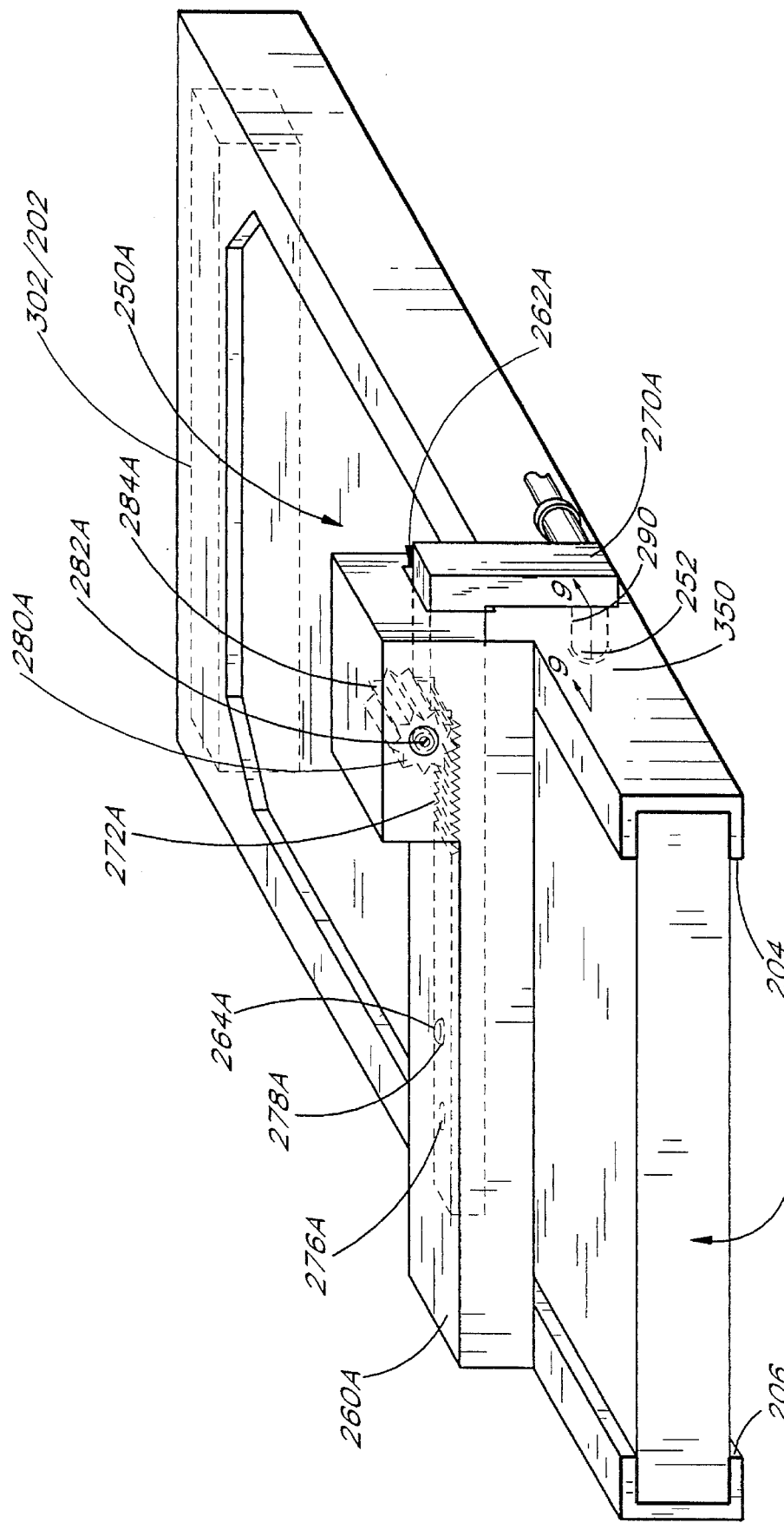
FIG. 8 is a perspective view of the PCMCIA card slot of FIGS. 2 and 3 and the PCMCIA card of FIG. 4, with the card inserted into the card slot and with the selectively engageable interface engaged.
Figure 9:
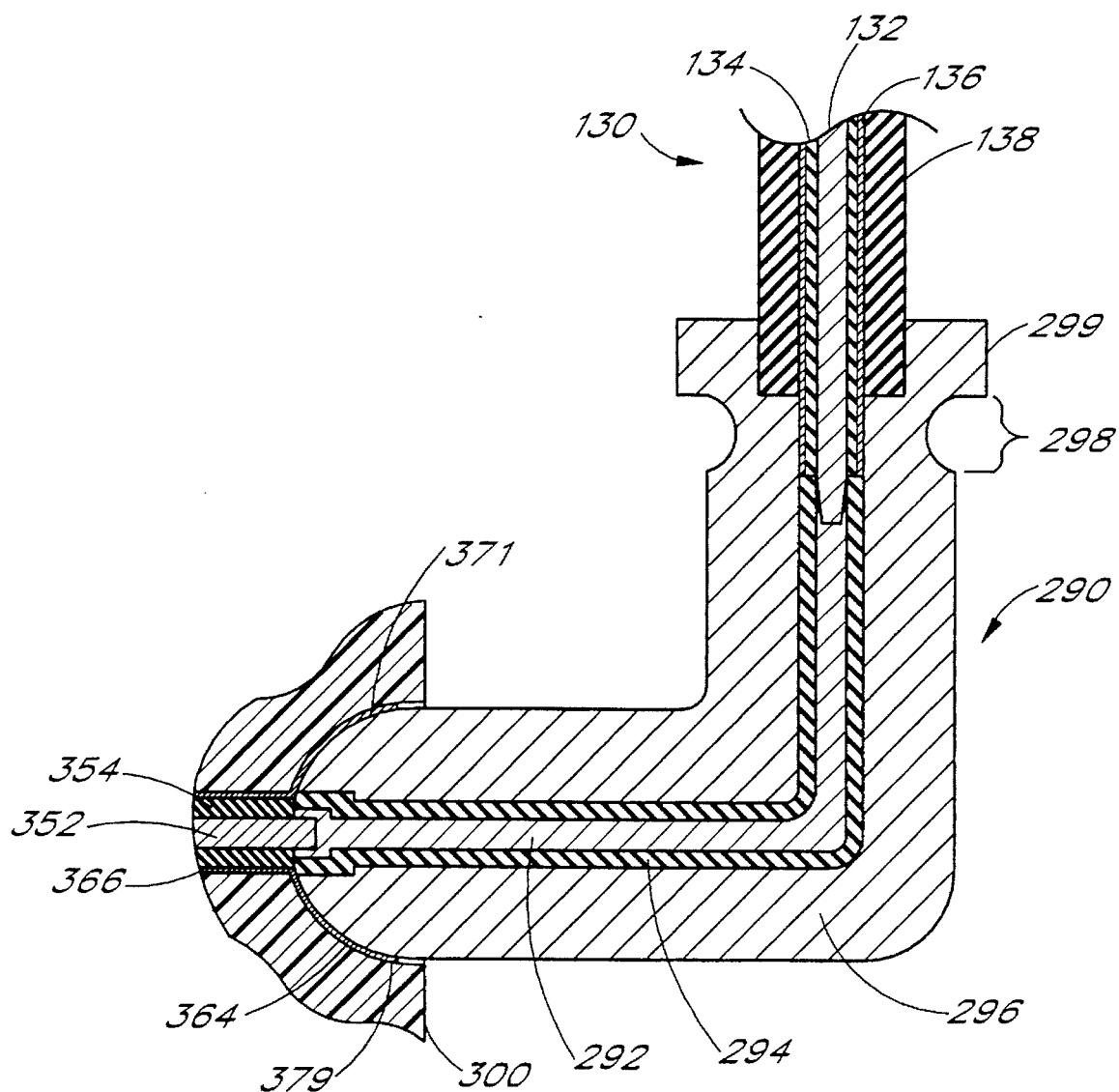
FIG. 9 is a cross-sectional view of the connection between the auxiliary base connector and the auxiliary card connector taken along the lines 9—9 in FIG. 8.

FIG. 8 is a perspective view of the card slot 200 and the circuit card 300 of the first embodiment, with the selectively engageable interface engaged. As illustrated in FIG. 8, the second detent 278A engages with the protrusion 264A when the rack 270A is in the second position. Thus, the auxiliary base connector 290 and the auxiliary card connector 350 are fully engaged, both electrically and mechanically, as illustrated in FIG. 9, and as described below.

Referring again to FIGS. 5 and 6, each of the outer conductors 371–386 preferably forms a substantially straight line between the inner edge 368 of the stopping surface 364 and a point near the outer edge 370 of the stopping surface 364. However, the outer conductors 371–386 are flexible. When the rack 270A is moved to the second position, with the circuit card 300 inserted into the card slot 200, the outer conductor 296 of the auxiliary base connector 290 contacts the outer conductors 371–386. The outer conductors 371–386 bend out toward the stopping surface 364 to conform to the generally hemispherical shape of the second end 293 of the auxiliary base connector 290 (see FIG. 9). However, the outer conductors 371–386 provide sufficient tension against the outer conductor 296 to ensure an adequate electrical connection between the outer conductors 371–386 and the outer conductor 296. The outer conductors 371–386 and the outer conductor 296 form an outer conductive path. The outer conductors 371–386 advantageously provide a uniform ground contact around substantially the entire circumference of the hemispherical shape of the outer conductor 296 to provide effective shielding of external noise. Also, the inner conductor 352 protrudes inside the hollow-cylindrical shape at the end of the inner conductor 292 and makes electrical contact with the inner conductor 292. In the preferred embodiment, the inner conductor 352 makes electrical contact with the inner conductor 292 by means of both end-to-end contact, and by means of frictional contact between the inner surface of the inner conductor 292 and the outer surface of the inner conductor 352. The inner conductors 352 and 292 form an inner conductive path. The insulators 354 and 294 insulate the outer conductive path from the inner conductive path. When the selectively engageable interface is engaged, an outer conductive path and an inner conductive path are established between the RF circuit (not shown) of the circuit card 300 and the RF antenna 124. The outer conductive path and the inner conductive path preferably provide high-bandwidth communication of RF signals between the RF circuit and the RF antenna 124.

The smooth, hemispherical shape of the second end 293 of the auxiliary base connector 290 reduces damage that may be caused to the auxiliary base connector 290 and the auxiliary card connector 350 if the circuit card 300 is removed from the card slot 200 before the auxiliary base connector 290 is fully retracted from the auxiliary card connector 350. The second end 293 of the auxiliary base connector 290 can have various other shapes as well, but the second end 293 preferably has no sharp edges. The smooth, hemispherical shape of the second end 293 of the auxiliary base connector 290 also minimizes the force required to insert the auxiliary base connector 290 into the auxiliary card connector 350. In addition, the recessed geometry of the inner conductor 292 further protects the inner conductor 292 from any damage in this situation. If the second end 293 of the auxiliary base connector 290 snags another surface, the inner conductor 292 is less likely to be damaged because of the recessed geometry.

An operator of the notebook computer 100 may use the circuit card 300 to provide additional capabilities to the notebook computer 100. To insert the circuit card 300, the operator uses a screw driver or similar tool to rotate the pinion gear driver 282A in a counter-clockwise direction to cause the rack 270A to move to the left, as necessary, so that the first detent 276A engages with the protrusion 264A. As described above, the rack 270A is now in the first position. When the rack 270A is at the first position, the auxiliary base connector 290 does not obstruct the first guide rail 204. The operator then slides the circuit card 300 into the PCMCIA card slot 200 until the primary card connector 302 engages with the primary base connector 202, and the movement stops. Electrical communication is established between the processor unit (not shown) and an electronic circuit (not shown) within the circuit card 300, through the primary base connector 202 and the primary card connector 302. If the circuit card 300 does not have an auxiliary card connector 350, the operator does not operate the actuator device 250A to engage the selectively engageable interface of the present invention. Generally, only circuit cards 300 that can utilize the RF antenna 124 have auxiliary card connectors 350.

If, on the other hand, the circuit card 300 does have an auxiliary card connector 350, the operator may operate the actuator device 250A to move the rack 270A to the second position. Again, as described above, the rack 270A is moved to the second position by rotating the pinion gear driver 282A in a clockwise direction until the second detent 278A engages with the protrusion 264A. When the rack 270A is moved to the second position, the auxiliary base connector 290 contacts the auxiliary card connector 350 to establish an RF connection between the RF antenna 124 and the RF circuit (not shown) within the circuit card 300. A bi-directional RF path is established involving the RF circuit, the auxiliary card connector 350, the auxiliary base connector 290, the coaxial cable 130, and the RF antenna 124. The operator can now establish a wireless communication link between the notebook computer 100 and a remote communication device.

As the operator enters commands to the notebook computer 100, the notebook computer 100 sends commands and data to the circuit card 300 and/or receives commands and data from the circuit card 300. The circuit card 300 uses the RF antenna 124 to transmit information to a remote communication device or receive information from a remote communication device. When the operator is finished using the circuit card 300, the operator can operate the actuator device 250A to move the rack 270A to the first position. Then, the circuit card 300 can be removed from the card slot 200.

FIG. 10 is a perspective view of the card slot 200 and the circuit card 300 of FIG. 1, implementing a second embodiment of the actuator device 250 which requires less horizontal width than the previous embodiment by locating the rack and pinion above circuit card 300 and by causing the auxiliary base connector 290 to be engaged and disengaged by vertical movement. The second embodiment also involves the placement of the auxiliary card connector 350 on an upper surface of the circuit card 300, which may be preferable from the standpoint of designing an RF circuit card. The second embodiment also adds flexibility to the design of the circuit card 300 because the auxiliary card connector 350 may be placed at substantially any location on the upper surface of the circuit card 300. The card slot 200 comprises the primary base connector 202, the first guide rail 204, the second guide rail 206, an actuator device 250B, and the auxiliary base connector 290. The actuator device 250B represents a second embodiment of the general actuator device 250. The actuator device 250B comprises an actuator housing 260B, a rack 270B, and a pinion gear 280B. The actuator housing 260B contains the pinion gear 280B. The pinion gear 280B comprises a pinion gear driver 282B. FIG. 10 also shows the coaxial cable 130 connected to the auxiliary base connector 290. FIG. 10 also illustrates the primary card connector 302 and the auxiliary card connector 350 of the circuit card 300.

FIG. 11 is a cross-sectional view of the card slot 200 and the circuit card 300 of FIG. 10, with the circuit card 300 inserted into the card slot 200, taken along the lines 11—11 of FIG. 10. The actuator housing 260B comprises a rack guide 262B for receiving the rack 270B. The rack guide 262B comprises a protrusion 264B. The rack 270B comprises a set of rack teeth 272B, a first detent 276B and a second detent 278B. The pinion gear 280B comprises a set of pinion gear teeth 284B.

Referring again to FIGS. 10 and 11, the primary base connector 202 is mechanically connected to the first guide rail 204 and the second guide rail 206. The actuator housing 260B is mechanically connected to the first guide rail 204 and the second guide rail 206. The actuator housing 260B may be formed integrally with the first guide rail 204 and the second guide rail 206. The pinion gear 280B is attached in a rotatable manner to the actuator housing 260B. The pinion gear driver 282B is attached to the pinion gear 280B in a manner that causes the pinion gear 280B to rotate when the pinion gear driver 282B is rotated. The rack 270B is inserted inside the rack guide 262B so that the rack teeth 272B engage with the pinion gear teeth 284B. The auxiliary base connector 290 is mechanically attached to the rack 270B. The primary card connector 302 is attached to a first edge of the circuit card 300, and the auxiliary card connector 350 is attached to the top side of the circuit card 300.

The actuator device 250B operates in a manner that is similar to the operation of the actuator device 250A. The pinion gear driver 282B of the illustrated embodiment receives and can be rotated by a standard screw driver. If the pinion gear driver 282B is rotated in a clockwise direction, the rack 270B slides upward in FIG. 11. If the pinion gear driver 282B is rotated in a counter-clockwise direction, the rack 270B slides downward in FIG. 11. When the rack 270B is slid to a first position, the first detent 276B of the rack 270B engages with the protrusion 264B of the rack guide 262B. The engagement of the first detent 276B with the protrusion 264B provides positive feedback that the rack 270B is in the first position. When the rack 270B is slid to a second position, the second detent 278B of the rack 270B engages with the protrusion 264B of the rack guide 262B. The engagement of the second detent 278B with the protrusion 264B provides positive feedback that the rack 270B is in the second position. The first and second detents 276B and 278B are also used to limit the range of movement of the rack 270B. FIGS. 10 and 11 illustrate the rack 270B in the first position. When moving from the first position to the second position, the rack 270B moves downward in FIG. 11. When the rack 270B reaches the second position, the auxiliary base connector 290 extends into the gap within the card slot 200, between the first guide rail 204 and the second guide rail 206. As a result, when the rack 270B is in the second position, the circuit card 300 cannot be inserted into the card slot 200.

When the rack 270B is in the first position, the circuit card 300 can be slid into the card slot 200, so that the primary card connector 302 fully engages with the primary base connector 202. When the circuit card 300 is fully inserted into the card slot 200, the auxiliary card connector 350 is aligned with the auxiliary base connector 290. Now, if the rack 270B is moved from the first position to the second position, the auxiliary base connector 290 contacts the auxiliary card connector 350. When the rack 270B is in the first position, the selectively engageable interface of the present invention is disengaged. When the circuit card 300 is inserted into the card slot 200 and the rack 270B is moved to the second position, the selectively engageable interface of the present invention is engaged. When the selectively engageable interface is engaged, the auxiliary base connector 290 engages with the auxiliary card connector 350, as described above with reference to FIGS. 5, 6, 7, 8, and 9 to form an inner conductive path and an outer conductive path between the RF circuit (not shown) in the circuit card 300 and the RF antenna 124.

Figure 12:
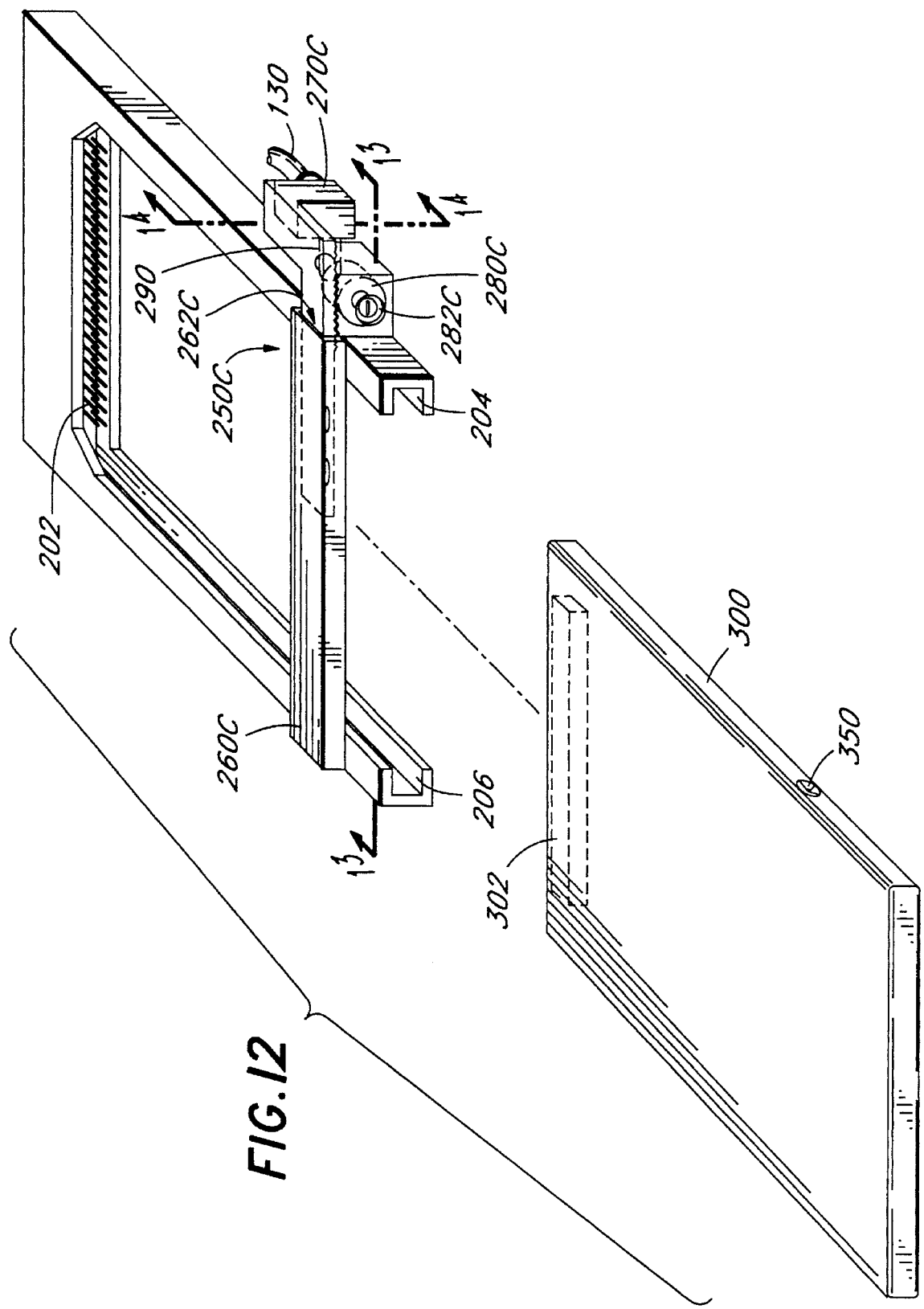
FIG. 12 is a perspective view of a PCMCIA card slot and card implementing a third embodiment of the selectively engageable interface of the present invention.

FIG. 12 is a perspective view of the card slot 200 and the circuit card 300 of FIG. 1, implementing a third embodiment of the actuator device 250 which requires less vertical height than the first and second embodiments by locating the rack and pinion to one side of the guide rail 204. As before, the card slot 200 comprises the primary base connector 202, the first guide rail 204, the second guide rail 206, an actuator device 250C, the auxiliary connector through-hole 252, and the auxiliary base connector 290. The actuator device 250C represents a third embodiment of the general actuator device 250. The actuator device 250C comprises an actuator housing 260C, a rack 270C, and a pinion gear 280C. The actuator housing 260C comprises a rack guide 262C for receiving the rack 270C. The actuator housing 260C contains the pinion gear 280C. The pinion gear 280C comprises a pinion gear driver 282C. FIG. 12 also shows the coaxial cable 130 connected to the auxiliary base connector 290. FIG. 12 also illustrates the primary card connector 302 and the auxiliary card connector 350 of the circuit card 300.

Figure 13:
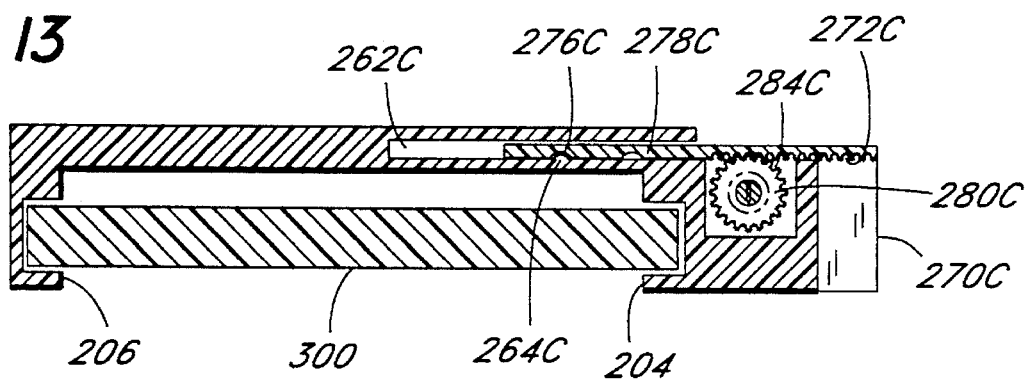
FIG. 13 is a cross-sectional view of the PCMCIA card slot and card of FIG. 12, with the card inserted into the card slot, taken along the lines 13—13 of FIG. 12.
Figure 14:
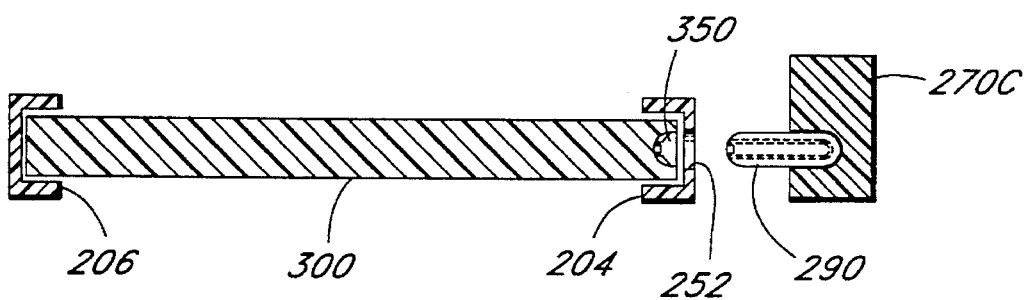
FIG. 14 is a cross-sectional view of the PCMCIA card slot and card of FIG. 12, with the card inserted into the card slot, taken along the lines 14—14 of FIG. 12.

FIG. 13 is a cross-sectional view of the card slot 200 and the circuit card 300 of FIG. 12, with the circuit card 300 inserted into the card slot 200, taken along the lines 13—13 of FIG. 12. FIG. 14 is another cross-sectional view of the card slot 200 and the circuit card 300 of FIG. 12, with the circuit card 300 inserted into the card slot 200, taken along the lines 14—14 of FIG. 12. The rack guide 262C comprises a protrusion 264C. The rack 270C comprises a set of rack teeth 272C, a first detent 276C and a second detent 278C. The pinion gear 280C comprises a set of pinion gear teeth 284C.

Referring again to FIGS. 12, 13, and 14, the primary base connector 202 is mechanically connected to the first guide rail 204 and the second guide rail 206. The actuator housing 260C is mechanically connected to the first guide rail 204 and the second guide rail 206. The actuator housing 260C may be formed integrally with the first guide rail 204 and the second guide rail 206. The pinion gear 280C is attached in a rotatable manner to the actuator housing 260C. The pinion gear driver 282C is attached to the pinion gear 280C in a manner that causes the pinion gear 280C to rotate when the pinion gear driver 282C is rotated. The rack 270C is inserted inside the rack guide 262C so that the rack teeth 272C engage with the pinion gear teeth 284C. The auxiliary base connector 290 is mechanically attached to the rack 270C. The primary card connector 302 is attached to a first edge of the circuit card 300, and the auxiliary card connector 350 is attached to a second edge of the circuit card 300.

The actuator device 250C operates in a manner that is similar to the operation of the actuator device 250A. The pinion gear driver 282C of the illustrated embodiment receives and can be rotated by a standard screw driver. If the pinion gear driver 282C is rotated in a clockwise direction, the rack 270C slides to the right in FIG. 13. If the pinion gear driver 282C is rotated in a counter-clockwise direction, the rack 270C slides to the left in FIG. 13. The geometric configuration of the rack 270C and the pinion gear 280C relative to the auxiliary base connector 290 balances the forces resulting from the rotation of the pinion gear driver 282C, in the preferred embodiment. Thus, when the pinion gear driver 282C is rotated to cause the rack 270C to slide, the force that produces the motion is distributed substantially evenly across different surfaces of the rack 270C, the pinion gear 280C and the auxiliary base connector 290. Also, the movement of the rack 270C is preferably restricted to a horizontal direction in FIG. 13, so that the rack 270C does not rotate in a direction that is perpendicular to the cross-section of FIG. 13.

When the rack 270C is slid to a first position, the first detent 276C of the rack 270C engages with the protrusion 264C of the rack guide 262C. The engagement of the first detent 276C with the protrusion 264C provides positive feedback that the rack 270C is in the first position. When the rack 270C is slid to a second position, the second detent 278C of the rack 270C engages with the protrusion 264C of the rack guide 262C. The engagement of the second detent 278C with the protrusion 264C provides positive feedback that the rack 270C is in the second position. The first and second detents 276C and 278C are also used to limit the range of movement of the rack 270C. FIGS. 12, 13, and 14 illustrate the rack 270C in the first position. When moving from the first position to the second position, the rack 270C moves to the left in FIG. 13. When the rack 270C reaches the second position, the auxiliary base connector 290 protrudes through the auxiliary connector through-hole 252 and extends into the gap within the first guide rail 204. As a result, when the rack 270C is in the second position, the circuit card 300 cannot be inserted into the card slot 200.

When the rack 270C is in the first position, the circuit card 300 can be slid into the card slot 200, so that the primary card connector 302 fully engages with the primary base connector 202. When the circuit card 300 is fully inserted into the card slot 200, the auxiliary card connector 350 is aligned with the auxiliary connector through-hole 252 and the auxiliary base connector 290. Now, if the rack 270C is moved from the first position to the second position, the auxiliary base connector 290 protrudes through the auxiliary connector through-hole 252 and contacts the auxiliary card connector 350. When the rack 270C is in the first position, the selectively engageable interface of the present invention is disengaged. When the circuit card 300 is inserted into the card slot 200 and the rack 270C is moved to the second position, the selectively engageable interface of the present invention is engaged. When the selectively engageable interface is engaged, the auxiliary base connector 290 engages with the auxiliary card connector 350, as described above with reference to FIGS. 5, 6, 7, 8 and 9 to form an inner conductive path and an outer conductive path between the RF circuit (not shown) in the circuit card 300 and the RF antenna 124.

In general terms, the actuator device 250 of the preferred embodiment comprises any mechanism that moves the auxiliary base connector 290 between the first position, in which the auxiliary base connector 290 does not make electrical contact with the auxiliary card connector 350, and the second position, in which the auxiliary base connector 290 does make electrical contact with the auxiliary card connector 350. The preferred embodiments of the actuator device 250, as described and illustrated herein, are fully manual, because a user must physically operate the actuator device 250A, 250B, or 250C to move the auxiliary base connector 290 between the first and second positions by rotating the pinion gear driver 282A, 282B or 282C. In another embodiment, the actuator device 250 may be partially automated. For example, the user may have to actuate the actuator device 250 by pressing a button, and the actuator device 250 then automatically moves the auxiliary base connector 290 between the first and second positions. The automatic movement of the auxiliary base connector 290 may be accomplished, for example, by a motorized rack and pinion device. In another embodiment, the actuator device 250 may be fully automated, so that the actuator device 250 is automatically actuated when the circuit card 300 is inserted into the card slot 200 to automatically move the auxiliary base connector 290 between the first and second positions, without the user having to do anything except slide the circuit card 300 into the card slot 200. This embodiment, for example, may involve a motorized rack and pinion device that is actuated by a mechanical or electrical switching device that is triggered by the insertion of the circuit card 300 into the card slot 200. Of the three preferred embodiments described herein, the first embodiment and the third embodiment are preferred over the second embodiment. A selection between the first embodiment and the third embodiment depends on geometrical limitations related to the electronic unit in which the selectively engageable interface is implemented.

Although described above in connection with particular embodiments of the present invention, it should be understood the descriptions of the embodiments are illustrative of the invention and are not intended to be limiting. Various modifications and applications may occur to those skilled in the art without departing from the true spirit and scope of the invention as defined in the appended claims.

What is claimed is:

1. An improved interface between a circuit card and a computer, said computer comprising a processing unit for executing computer programs and an RF antenna for facilitating wireless communication functions, said improved interface comprising a primary interface between said circuit card and said processing unit and an auxiliary interface between said circuit card and said RF antenna, said circuit card utilizing said RF antenna to provide a wireless communication function to said computer, said auxiliary interface comprising:

a circuit card;

an auxiliary card connector on said circuit card;

a computer;

an auxiliary base connector in said computer, said auxiliary base connector being movable between a first position and a second position, said first position allowing said circuit card to be inserted into said computer, said second position providing electrical contact between said auxiliary base connector and said auxiliary card connector when said circuit card is inserted into said computer; and an actuator device for moving said auxiliary base connector between said first position and said second position.

2. The improved interface of claim 1, wherein said actuator device is manually actuated and manually operated.

3. The improved interface of claim 2, wherein said actuator device comprises a rack having a plurality of teeth and a pinion gear also having a plurality of teeth, said auxiliary base connector being attached to said rack, and wherein said plurality of teeth of said pinion gear engage with said plurality of teeth of said rack so that when said pinion gear is rotated, said pinion gear drives said rack to move said auxiliary base connector into contact with said auxiliary card connector.

4. The improved interface of claim 1:
   wherein said auxiliary base connector has a substantially smooth engaging surface, said auxiliary base connector comprising:
   a first base conductor, said first base conductor being recessed from said engaging surface of said auxiliary base connector;
   a second base conductor; and
   a base insulator, said base insulator insulating said first base conductor from said second base conductor;
   wherein said auxiliary card connector has a substantially smooth engaging surface, said engaging surface of said auxiliary card connector corresponding to said engaging surface of said auxiliary base connector, said auxiliary card connector comprising:
   a first card conductor, said first card conductor protruding from said engaging surface of said auxiliary card connector;
   a second card conductor; and
   a card insulator, said card insulator insulating said first card conductor from said second card conductor; and
   wherein when said auxiliary base connector is in said second position, said first base conductor makes electrical contact with said first card conductor and said second base conductor makes electrical contact with said second card conductor.

5. The improved interface of claim 4, wherein said second base conductor comprises a convex, substantially hemispherical surface at said engaging surface of said auxiliary base connector, wherein said auxiliary card connector comprises a corresponding concave, substantially hemispherical surface at said engaging surface of said auxiliary card connector, and wherein said second card conductor comprises a plurality of conductor elements for establishing a substantially uniform electrical contact between said second card conductor and said second base conductor around substantially the entire circumference of said second base conductor.

6. An interface apparatus for establishing a first interface between an electronic unit and a circuit card, said electronic unit having a first base connector, said circuit card having a first card connector, said circuit card being insertable into said electronic unit so that said first base connector engages with said first card connector to form a second interface between said electronic unit and said circuit card, said interface apparatus comprising:
   an electronic unit;
   a second base connector attached to said electronic unit;
   a circuit card;
   a corresponding second card connector attached to said circuit card; and
   an actuator device for selectively engaging said second base connector with said second card connector to form said first interface between said electronic unit and said circuit card.

7. The interface apparatus of claim 6, wherein said actuator device is manually actuated.

8. The interface apparatus of claim 7, wherein said actuator device moves said second base connector into contact with said second card connector to form said first interface, said second card connector remaining substantially stationary.

9. The interface apparatus of claim 7, wherein said actuator device is manually operated.

10. The interface apparatus of claim 9, wherein said actuator device moves said second base connector into contact with said second card connector to form said first interface, said second card connector remaining substantially stationary.

11. The interface apparatus of claim 6, wherein said actuator device comprises a rack having a plurality of teeth and a pinion gear also having a plurality of teeth, said second base connector being attached to said rack, and wherein said plurality of teeth of said pinion gear engage with said plurality of teeth of said rack so that when said pinion gear is rotated, said pinion gear drives said rack to move said second base connector into contact with said second card connector.

12. The interface apparatus of claim 11, wherein said actuator device additionally comprises an actuator housing, wherein said rack moves within said actuator housing, said actuator housing comprising a protrusion, and wherein said rack additionally comprises:
    a first detent for engaging with said protrusion when said rack is at a first position in which said auxiliary base connector does not contact said auxiliary card connector; and
    a second detent for engaging with said protrusion when said rack is at a second position in which said auxiliary base connector does contact said auxiliary card connector.

13. The interface apparatus of claim 6, wherein said second base connector comprises a base inner conductor, a base insulator, and a base outer conductor, wherein said second card connector comprises a card inner conductor, a card insulator, and a card outer conductor, and wherein, when said second base connector is engaged with said second card connector:
    said base inner conductor contacts said card inner conductor;
    said base outer conductor contacts said card outer conductor;
    said base insulator insulates said base inner conductor from said base outer conductor; and
    said card insulator insulates said card inner conductor from said card outer conductor.

14. The interface apparatus of claim 13, wherein said base outer conductor and said base insulator form a convex, substantially hemispherical shape, and wherein said card outer conductor forms a corresponding concave, substantially hemispherical shape.

15. The interface apparatus of claim 14, wherein said base inner conductor is recessed from said substantially hemispherical shape formed by said base outer conductor and said base insulator, and wherein said card inner conductor protrudes from said substantially hemispherical shape formed by said card outer conductor.

16. The interface apparatus of claim 6, wherein said second base connector is connected to a first end of a coaxial cable, wherein a second end of said coaxial cable is connected to an RF antenna, and wherein an RF link is established between said circuit card and said RF antenna when said second base connector is engaged with said second card connector.

17. The interface apparatus of claim 6, wherein said electronic unit comprises a computer.

18. The interface apparatus of claim 17, wherein said computer comprises a notebook computer.

19. An interface apparatus for providing an RF interface between a circuit card and an electronic unit, said interface apparatus comprising:

an electronic unit;

a base connector connected to said electronic unit, said base connector having a substantially smooth engaging surface, said base connector comprising:

- a first base conductor, said first base conductor being recessed from said engaging surface of said base connector;
- a second base conductor, wherein said second base conductor comprises a convex, substantially hemispherical surface at said engaging surface of said base connector; and
- a base insulator, said base insulator insulating said first base conductor from said second base conductor;

a circuit card;

a card connector connected to said circuit card, wherein said card connector comprises a corresponding concave, substantially hemispherical surface at said engaging surface of said card connector, said card connector comprising:

- a first card conductor, said first card conductor protruding from said engaging surface of said card connector;
- a second card conductor, wherein said second card conductor comprises a plurality of conductor elements for establishing a substantially uniform electrical contact between said second card conductor and said second base conductor around substantially the entire circumference of said second base conductor; and
- a card insulator, said card insulator insulating said first card conductor from said second card conductor;

and an actuator device for engaging said base conductor with said card connector so that said first base conductor makes electrical contact with said first card conductor and said second base conductor makes electrical contact with said second card conductor.

\* \* \* \* \*